(12) United States Patent
Nakano et al.

(10) Patent No.: US 6,920,687 B2
(45) Date of Patent: Jul. 26, 2005

(54) COMPONENT MOUNTING METHOD EMPLOYING TEMPERATURE MAINTENANCE OF POSITIONING APPARATUS (75) Inventors: Tomoyuki Nakano, Kofu (JP); Koji Odera, Kofu (JP); Takeshi Kuribayashi, Nakakoma-gun (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 545 days.

(21) Appl. No.: 10/007,821

(22) Filed: Dec. 5, 2001

(65) Prior Publication Data
US 2002/0044432 A1 Apr. 18, 2002

(30) Foreign Application Priority Data
Dec. 6, 2000 (JP) ........................................ 2000-371274

(51) Int. Cl.[7] ................................................. H05K 3/30
(52) U.S. Cl. .............................. 29/832; 29/739; 29/740; 29/743; 29/833; 414/737; 414/751.1; 414/752.1; 901/40; 294/64.1
(58) Field of Search ........................... 29/739, 740, 741, 29/742, 743, DIG. 44, 832, 833, 834, 836, 839, 840, 841; 414/737, 751.1, 752.1; 901/40

(56) References Cited
U.S. PATENT DOCUMENTS 6,099,678 A * 8/2000 Kotato et al. ............... 156/256
6,122,823 A * 9/2000 Kira et al. ..................... 29/840

* cited by examiner

*Primary Examiner*—Rick Kiltae Chang
(74) *Attorney, Agent, or Firm*—Jordan and Hamburg LLP (57) ABSTRACT A component mounting method for picking up an electronic component, positioning the electronic component on a circuit substrate and mounting the electronic component to the circuit substrate adapted to perform an idling operation during a pause of component mounting operation, thereby eliminating any degradation of the component mounting accuracy due to temperature changes.

6 Claims, 11 Drawing Sheets

|   | Temperature change of unit | Temperature °C |
|---|---|---|
| 1 | X-axis robot | 27 |
| 2 | Y-axis robot | 27 |
| 3 | Head | 25 |
| 4 | Component recognition camera | 25 |

*Fig. 11*
*Prior Art*

COMPONENT MOUNTING METHOD EMPLOYING TEMPERATURE MAINTENANCE OF POSITIONING APPARATUS

The present disclosure relates to subject matter contained in priority Japanese Patent Application No. 2000-371274, filed on Dec. 6, 2000, the contents of which is herein expressly incorporated by reference in its entirety.

BACKGROUND OF THE INVENTION

1. Field of the Invention

The present invention relates to a component mounting method and a component mounting apparatus for mounting electronic components and other components on a circuit substrate.

2. Description of Related Art

Figure 10:
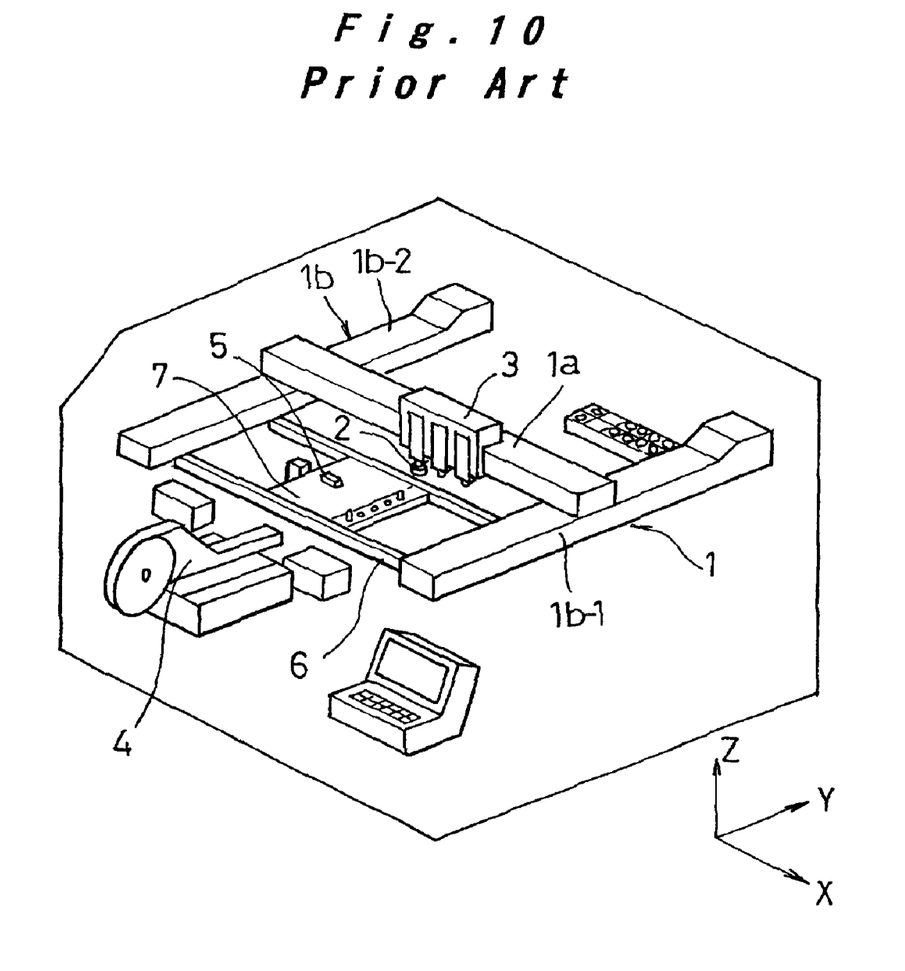
FIG. 10 is a schematic perspective view of a conventional component mounting apparatus, illustrating its configuration.

A conventional electronic component mounting apparatus shown in FIG. 10 includes an XY robot 1 adapted to position a head 3 having a nozzle 2. The XY robot 1 includes an X-axis robot 1a and Y-axis robots 1b-1 and 1b-2. An electronic component 5 is picked up from a component supply section 4 by the nozzle 2 and is moved with the head 3 to the mounting position on the circuit substrate 7 that is secured to an XY table 6. Then, the electronic component 5 is mounted onto the circuit substrate 7.

The operation of mounting the electronic component 5 on the circuit substrate 7 requires an enhanced degree of precision particularly when a number of components are to be arranged densely on the circuit substrate 7. For instance, if a 0.6 mm long and 0.3 mm wide micro-chip is displaced by more than ±25 µm from the right mounting position, stable bonding of an electrode of the chip and a corresponding land of the circuit substrate can not be achieved. However, the X-axis robot, the Y-axis robot, the center position of a camera CCD and various other parts of the machine frame become displaced due to temperature changes caused by environmental temperature changes, heat generated by a drive motor and other motors when the machine is made to start operating, and heat generated in sliding areas of the X-axis/Y-axis robots and so on. Consequently, the centers of components are displaced from the predetermined respective positions, thereby decrease the accuracy of mounting of the components.

This problem will be described in detail with reference to FIG. 11.

Figure 11:
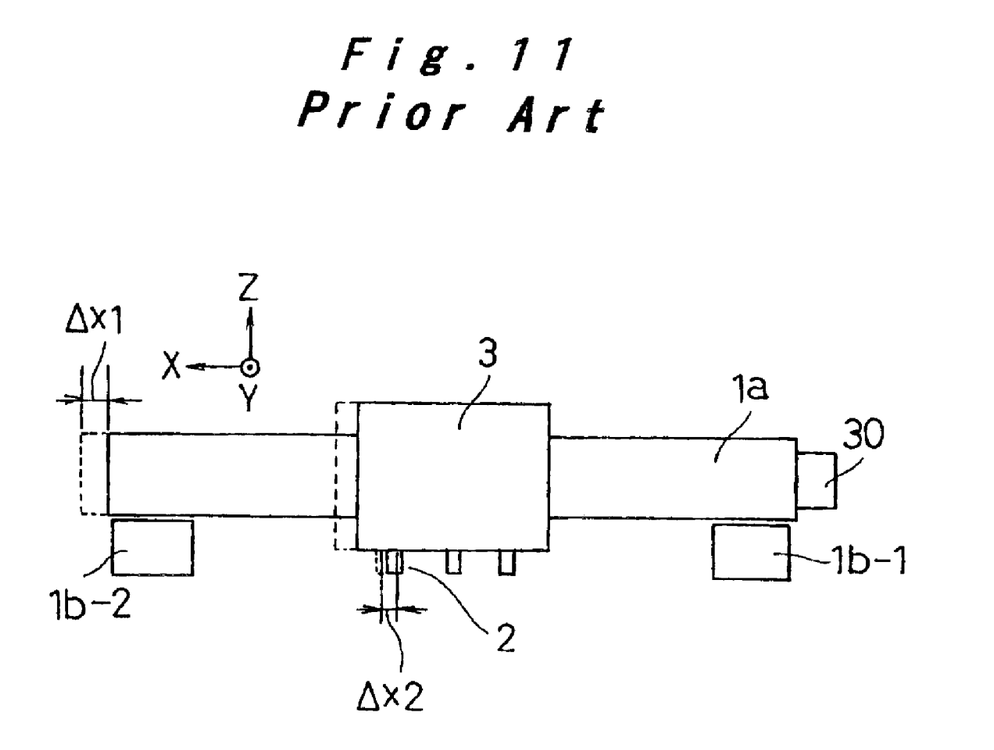
FIG. 11 is a schematic illustration of displacements of a head and an XY robot of the conventional apparatus due to a temperature change.

In FIG. 11, the X-axis robot 1a drives the head 3 along the X-axis by employing a motor 30, while the Y-axis robots 1b-1 and 1b-2 support the X-axis robot 1a at the respective ends thereof and drive the X-axis robot along the Y-axis (running in a direction perpendicular to the sheet showing FIG. 11). Normally, it is so arranged that one of the opposite ends of the X-axis robot 1a, e.g., the end where the Y-axis robot 1b-1 is located, is rigidly held, while the other end thereof, e.g., the end where the Y-axis robot 1b-2 is located, is able to slide in the X-direction.

The X-axis robot 1a receives heat generated by the motor 30, and frictional heat of the head 3 as well as that of the X-axis robot 1a itself as it slides on the Y-axis robots 1b-1 and 1b-2. The X-axis robot 1a expands as the temperature thereof rises. Particularly, the X-axis robot 1a expands in the X-direction at the side of the Y-axis robot 1b-2 by $\Delta X_1$. As a result of the expansion, the head 3 is displaced in the X-direction by the amount indicated by a broken line in FIG. 11. Accordingly, the nozzle 2 is displaced in the X-direction by $\Delta X_2$.

The Y-axis robots 1b-1 and 1b-2 and frames supporting the Y-axis robots also receive heat and expand in a similar way. Thus, the nozzle 2 is displaced by the combined effect of these expansions.

While the displacement of the nozzle 2 may be very small, it will become unnegligible when it exceeds the required accuracy of positional arrangement.

Known electronic component mounting apparatus is normally provided with an automatic calibration feature for preventing degradation in the accuracy of positional arrangement due to temperature change. With this feature, whenever necessary, the electronic component mounting apparatus automatically carries out a calibrating operation as a function of the temperature change from a predetermined level or the time elapsed from the last calibration. The calibrating operation is carried out by attaching a calibration jig to the nozzle 2, the jig for determining the center of the nozzle 2 of the head 3, positioning the jig, picking up an image of the nozzle 2 with a camera, determining a displacement of the center of the nozzle 2 in terms of coordinates adopted for positioning, and updating the amount of offset (positional displacement due to temperature changes) relative to the mechanical original point of the apparatus.

However, the amount of offset relative to the mechanical original point of the apparatus as determined with the calibration jig is the sum of the amounts of offset of each of the units (including the head 3, the XY robots 1, and the camera) due to temperature changes. The amount of offset of each unit varies from a time of measurement to another so that errors arise. Consequently, the accuracy of positional arrangement of electronic component may be degraded even when the units are corrected in accordance with the amount of offset obtained by the calibrating operation.

Additionally, with the above-described scheme of automatic calibration, the nozzle, the camera and other components need to be subjected to a calibrating operation individually so that the productivity will deteriorate.

Still additionally, when the apparatus is made to start operating after a long pause spent for switching to a different type of devices, the amount of offset varies immediately because the temperature change is going on in the start-up phase. This means that the amount of offset obtained by the automatic calibration is reduced useless and the amount of the offset of each of the units needs to be determined anew.

SUMMARY OF THE INVENTION

In the light of the above problems, an object of the present invention is to provide a component mounting method and a component mounting apparatus that prevents positional displacements of electronic components due to temperature changes and improves the productivity thereof.

According to the invention, there is provided a component mounting method and a component mounting apparatus including picking up an electronic component, positioning the electronic component on a circuit substrate, and mounting the electronic component onto the circuit substrate, the method and apparatus being adapted to eliminate any fall of the temperature of the apparatus during a pause of component mounting operation, thereby eliminating any reduction of the component mounting accuracy due to temperature changes.

Preferably, the apparatus is made to run idle during a pause of component mounting operation. The idling operation may be carried out during a standby period of the substrate. Alternatively, it may be carried out when a controller determines that the temperature change of each of the units or a suspending time is out of the allowable limit during a pause of component mounting operation for switching to a different type of devices or for a maintenance operation.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

Preferred embodiments of the present invention will be hereinafter described with reference to FIGS. 1 through 9B.
[First Embodiment]

Figure 1:
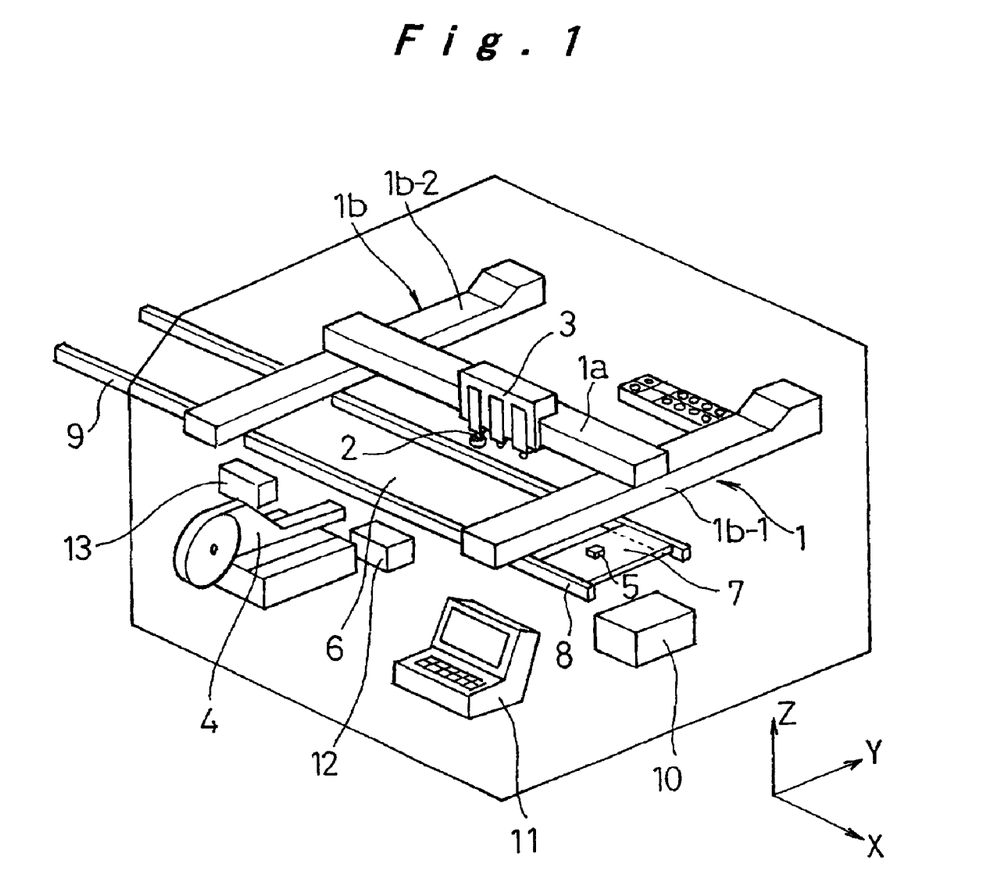
FIG. 1 is a schematic perspective view of a first embodiment of a component mounting apparatus according to the invention, illustrating its configuration.

A first embodiment will be described with reference to FIGS. 1 to 5. FIG. 1 illustrates the configuration of a component mounting apparatus according to the embodiment. As shown in FIG. 1, an XY robot 1 is adapted to position a head 3 having a nozzle 2. The XY robot 1 includes an X-axis robot 1a for positioning the head 3 in the X-direction and Y-axis robots 1b (1b-1 and 1b-2) for positioning the head 3 in the Y-direction, and the head 3 includes an H-axis robot 31 (see FIG. 2) for positioning the nozzle 2 in the Z-direction by moving the nozzle vertically. Reference numeral 4 denotes a component supply section for supplying an electronic component 5. Reference numeral 6 denotes a positioning table for positioning a circuit substrate 7 in the Y-direction. Reference numeral 8 denotes a loader section for receiving a circuit substrate 7 from the preceding process and reference numeral 9 denotes an unloader section for holding the circuit substrate 7 mounted with electronic components in a standby state before it is transferred to the next step. Although not shown, the unloader section 9 is arranged along a carrier rail and adapted to convey the circuit substrate 7 by employing a motor-driven belt. Reference numeral 10 denotes a controller for controlling the operation of each of the units including the XY robot 1, the head 3, the component supply section 4, the positioning table 6, the loader section 8 and the unloader section 9, and reference numeral 11 denotes an operating section adapted to be used for the operation of inputting NC programs. Reference numeral 12 denotes a component recognition camera for recognizing the electronic component 5 picked up from the component supply section 4 by the nozzle 2 and reference numeral 13 denotes a nozzle station for storing a spare nozzle.

Figure 2:
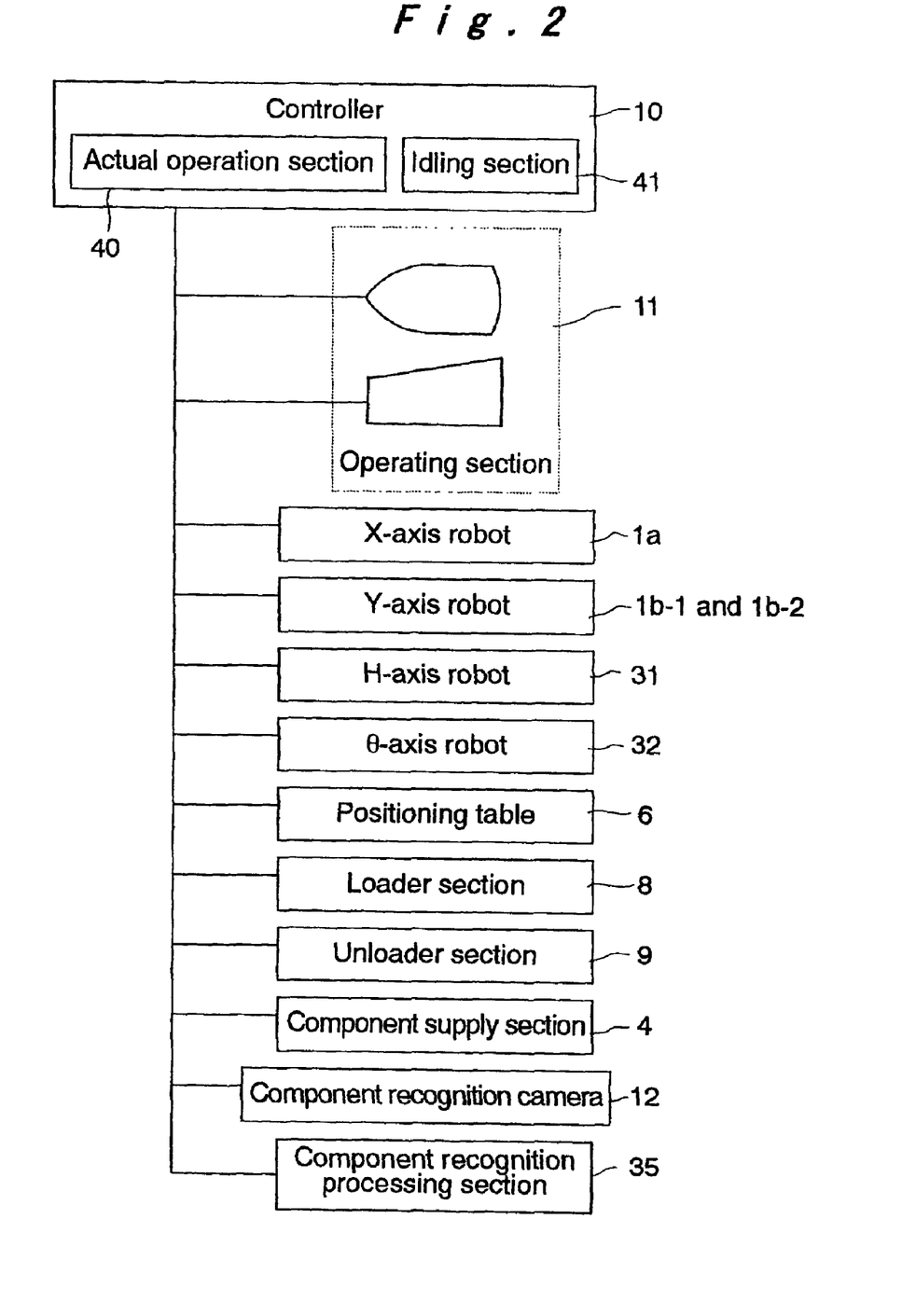
FIG. 2 is a block diagram according to the embodiment, illustrating the system for controlling the apparatus.

Now, the operation of controlling the component mounting apparatus according to the embodiment will be described with reference to FIG. 2.

The X-axis robot 1a moves the head 3 in the X-direction by rotating a ball screw by a motor under control of the controller 10. The Y-axis robots 1b-1 and 1b-2 support the X-axis robot 1a at the opposite ends thereof and drives it in the Y-direction by rotating respective ball screws by a motor under control of the controller 10. Thereby, the nozzle 2 of the head 3 is moved on the XY plane until it is placed at a desired position. Alternatively, the X-axis robot 1a and the Y-axis robots 1b-1 and 1b-2 may be driven by a linear motor.

The H-axis robot 31 moves the nozzle 2 vertically in the Z-direction under control of the controller 10. An θ-axis robot 32 rotates the nozzle 2 around its axial center under control of the controller 10 until the picked up component shows the right mounting angle.

The positioning table 6, the loader section 8 and the unloader section 9 are adapted to transfer the circuit substrate 7 by driving the carrier belt by a corresponding motor under control of the controller 10.

The component supply section 4 supplies electric components sequentially by moving at respective pitches a tape holding the components thereon at regular intervals employing a motor under control of the controller 10.

The component recognition camera 12 picks up an image of the component being moved by the head 3 to show the position at which it is held by the nozzle 2 and its posture under control of the controller 10. The picked up image is input to a component recognition processing section 35, which processes the input image and detects the displacement of the center of the component and that of the nozzle and the angular displacement of the component. The controller 10 issues a command to the X-axis robot 1a, the Y-axis robots 1b-1 and 1b-2 and the θ-axis robot 32 so as to make the component to be mounted on the circuit substrate at the right position and at the right angle, using the detected amounts of displacement for correction.

Next, the operation of the component mounting apparatus having the above-described configuration will be discussed below. The circuit substrate 7 is moved from the loader section 8 onto the positioning table 6 and placed in position. Then, the head 3 is driven to move and make the nozzle 2 pick up the electronic component 5 from the component supply section 4. The head 3 is further driven to move to the mounting position on the circuit substrate 7 and cause the nozzle 2 to mount the electronic component 5 held by it on the circuit substrate 7. The circuit substrate 7 is then transferred to the next step by the unloader section 9. All the above operation is carried out under control of the actual operation section 40 in the controller 10.

Figure 5:
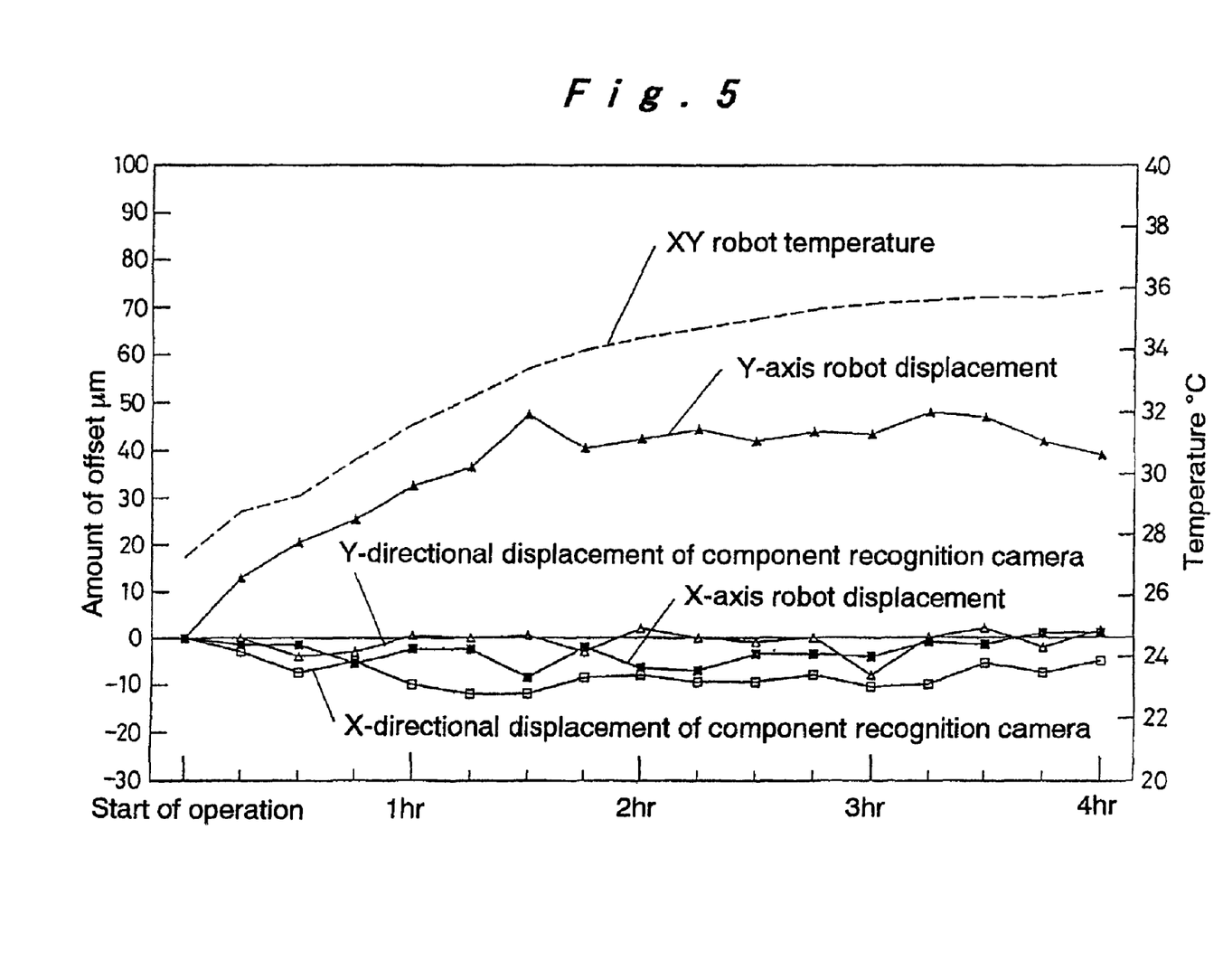
FIG. 5 is a graph illustrating the relationship between the temperature change of the apparatus after starting a component mounting operation and the positional displacements of various units of the apparatus.

In the above-described component mounting apparatus, the temperature of each of the units rises from the start of the operation. Then, each of the units will thermally expand and eventually deflected due to the thermal expansion to consequently displace the nozzle 2. FIG. 5 schematically illustrates how the nozzle 2 is displaced. FIG. 5 is a graph illustrating the relationship between the temperature change of the XY robot 1 with time after starting a component mounting operation and the positional displacements in the X- and Y-directions with time of various units of the apparatus, including the X-axis robot 1a, the Y-axis robots 1b and the component recognition camera 12. As shown in FIG. 5, the temperature of the XY robot 1 rises from the start of the operation and the displacement of the Y-axis robot 1b increases accordingly. However, after the elapse of a certain period of time, both the temperature and the displacement come to be held to a stabile state.

Consequently, the amount of offset of the nozzle 2 (displacement due to temperature change) is held to a stable level to ensure a high degree of accuracy for the mounting operation if the time required for the XY robot 1 to rise to the stable state from the start of the mounting operation is shortened and the stable state is maintained during the mounting operation.

The component mounting apparatus according to the embodiment operates in a manner as described below to maintain the stable state.

Figure 3:
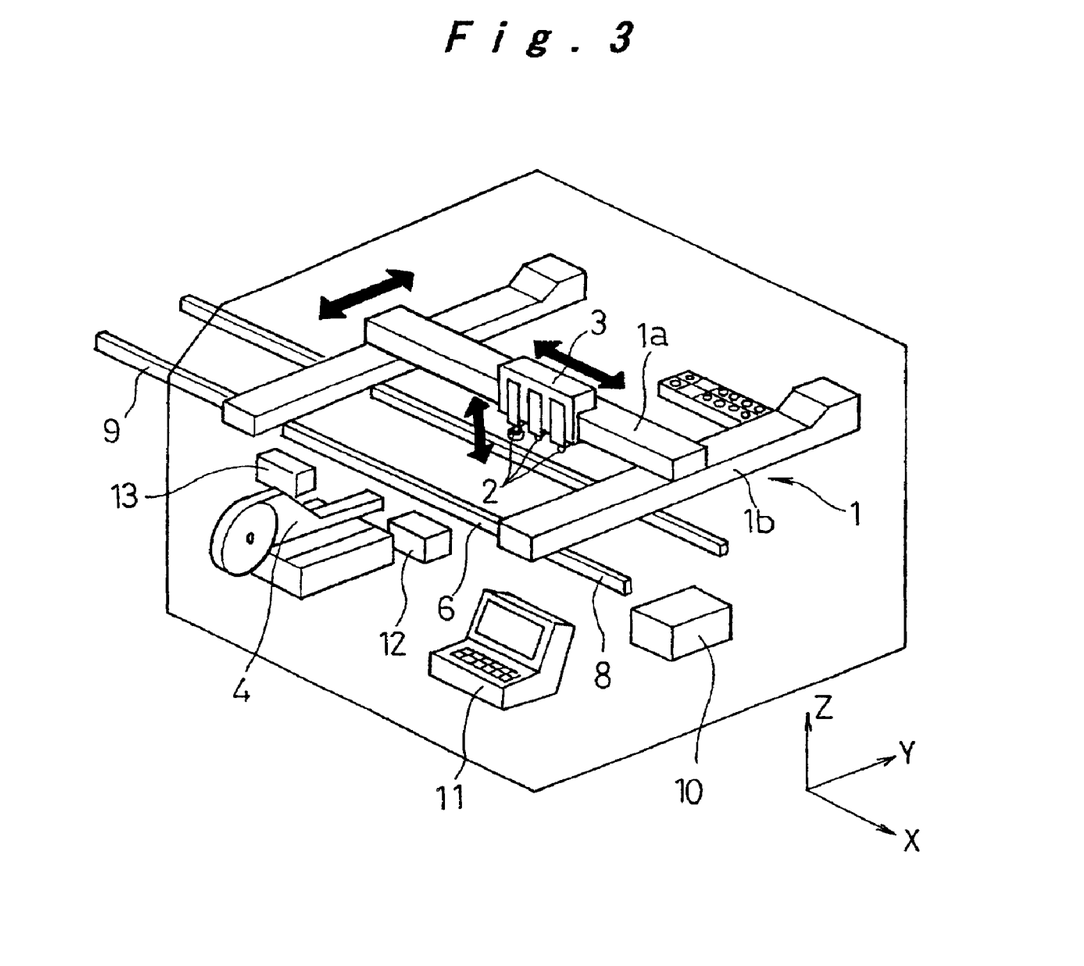
FIG. 3 is a schematic illustration of an idling operation according to the embodiment.

When a next circuit substrate 7 is not found in the loader section 8 or the next circuit substrate 7 is being transferred from the loader section 8 onto the positioning table 6, the X-axis robot 1a and the Y-axis robots 1b of the XY robot 1 and the H-axis robot 31 automatically and idly move back and forth between the mechanical original point and the point at the maximum traveling distance from the original point or a predetermined point. As a result of this idling operation, the temperature of each of the related units is maintained to the stable level for operation to ensure a high degree of accuracy. The idling operation is controlled by an idling section 41 of the controller 10.

Figure 4:
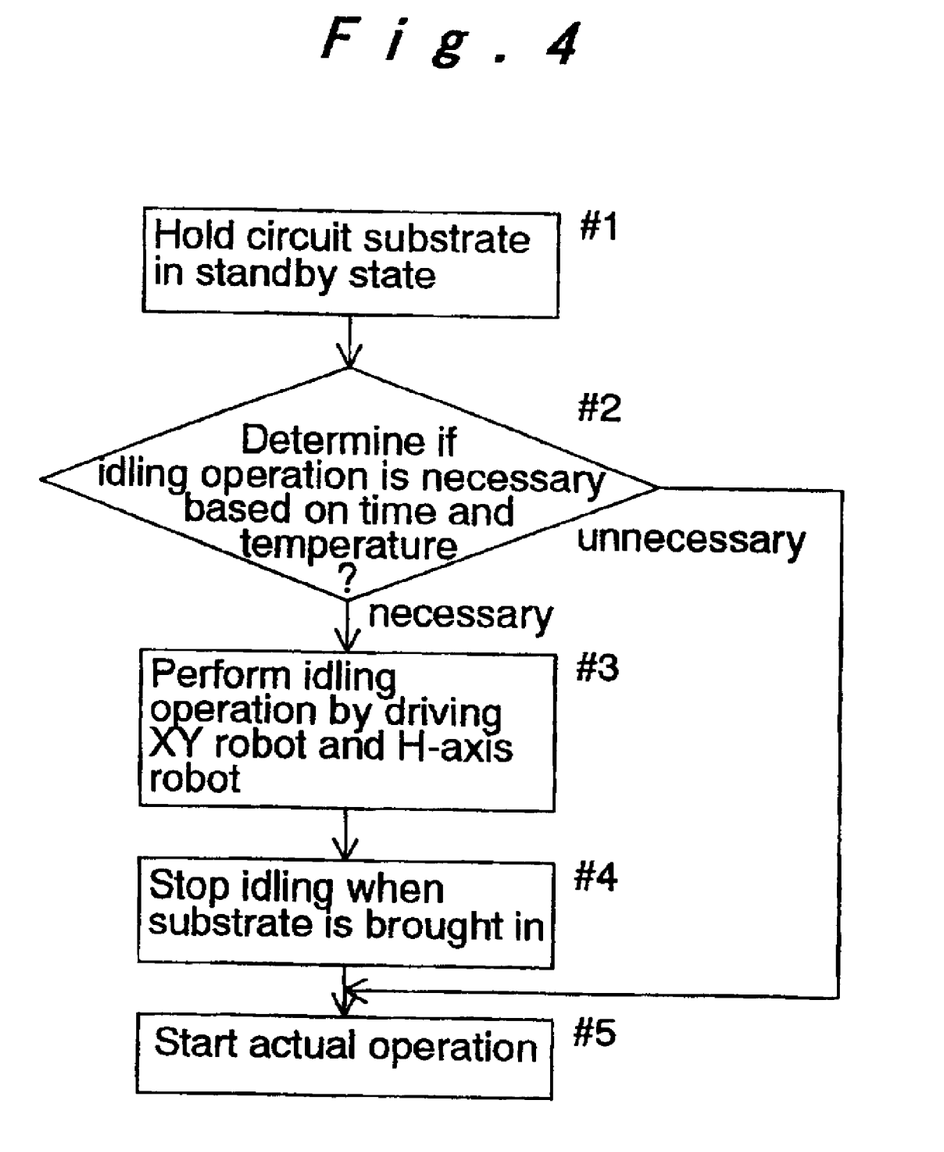
FIG. 4 is a flow chart of the idling operation according to the embodiment.

The control procedure of the idling operation will be described below with reference to the flow chart of FIG. 4. As the controller 10 (the idling section 41) detects that there is a circuit substrate 7 in a standby state (Step #1), it determines if an idling operation is necessary or not by referring to the time elapsed since the last operation of mounting electronic components or the temperature of each of the related units (including the head 3, the XY robot 1 and the component recognition camera 12) (Step #2). If it is determined that an idling operation is necessary, the controller 10 issues a command for the idling operation and drives the X-axis and the Y-axis of the XY robot 1 and the H-axis of the head 3 for the idling operation (Step #3). If, on the other hand, it is determined that no idling operation is necessary, it switches the control to the actual operation section 40 and stands by without any idling operation until a circuit substrate 7 is brought in. When a circuit substrate 7 is moved onto the positioning table 6 while the apparatus is operating idly, it stops the idling operation (Step #4) and starts the operation of mounting the electronic component 5 (switches the control to the actual operation section 40) (Step #5). Thus, the mechanical positional accuracy of the head 3 due to the temperature change of each of the units is minimized.

It may alternatively be so arranged that the idling operation continues so long as the controller 10 keeps on issuing the command for the idling operation on the basis of the standby period, the temperature change of each of the units and other factors.

Additionally, it may be so arranged that, if the controller 10 determines in Step #4 that the temperature of each of the units and the amount of offset of the nozzle 2 have not been put back to the stable state at the time when the circuit substrate 7 is brought in, it continues the idling operation until the stable state is restored, suspending the transfer of the circuit substrate 7 to give priority to the mounting accuracy. The operator gives priority to either the mounting accuracy or the availability ratio of the apparatus by so setting the controller 10 by way of the operating section 11.

The traveling distance of each of the robots in the idling operation is determined on the basis of the temperature fall of each of the units from that of the stable state and the time before the start of the next component mounting operation. It will be appreciated that the time required for restoring the stable state is reduced by increasing the traveling distance and the traveling rate of the movement.

Any method may be used for detecting the temperature of each of the units. Instead of detecting the temperatures of the units, the amount of offset of the nozzle 2 may be monitored and detected.

[Second Embodiment]

Next, a second embodiment of the component mounting apparatus adapted to perform an idling operation when the normal operation of the apparatus is suspended for switching to a different type of device to be assembled by the embodiment will be described.

An idling operation will be carried out automatically during the period for switching to a different type of device to be assembled by the apparatus by defining so at the time of initializing the apparatus. In addition, the idling operation will be carried out by the time control or temperature control feature of the controller 10 whenever the normal operation of the apparatus is suspended for a predetermined period of time or the temperature of the apparatus changes beyond a predetermined limit.

According to the embodiment, the change in the amount of offset from the mechanical original point of the apparatus is minimized when the apparatus is at rest.

Instead of carrying out an automatic idling operation, the idling operation may be started and stopped by turning on and off a switch for idling operations of the operating section 11.

An additional switch may be provided so as to select a manual idling operation mode where an idling operation is started and stopped by operating the above switch or an automatic idling operation mode where the controller 10 starts and stops an idling operation according to its own judgment.

[Third Embodiment]

Figure 6:
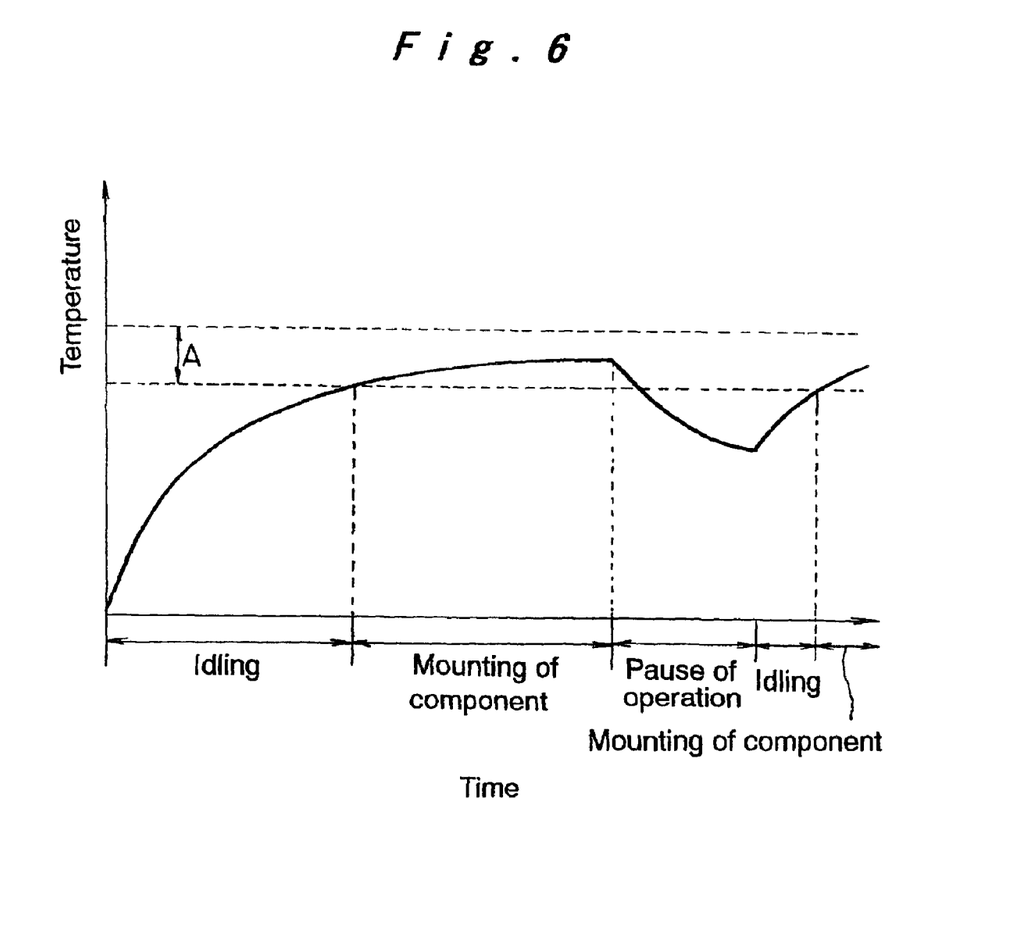
FIG. 6 is a graph illustrating the operation of controlling the idling operation according to a third embodiment of the invention.

A third embodiment of the component mounting apparatus according to the invention will be described with reference to FIGS. 5 and 6. This embodiment is adapted to automatically start an idling operation on the basis of the correlation of the time elapsed since the start of operation of the apparatus, the temperature and the mounting accuracy.

Referring firstly to FIG. 5, as the apparatus starts operating, the temperature rises. Two hours after the start, the temperature rise becomes saturated and the displacement of any of the units is stabilized. As shown in FIG. 6, an allowable temperature zone A where the displacement of any of the units does not go beyond the mounting accuracy limit is defined for the apparatus. As the temperature of the apparatus goes into the allowable temperature zone A, the idling operation of the apparatus is terminated to start an actual mounting operation.

If the apparatus stops the mounting operation because the next circuit substrate is not in position or the apparatus has to switch to a different type of devices, the controller 10 determines if the apparatus needs to start an idling operation by referring to the allowable temperature zone A and the current temperature on the basis of the correlation of the duration of idling and the temperature rise stored in the data base.

It may be so arranged that, once an idling operation starts, the controller 10 measures the duration of the operation and also constantly observes the temperature of each of the units and the apparatus stops the idling operation when the controller 10 determines that the temperature of the apparatus has gone into the allowable temperature zone A.

[Fourth Embodiment]

A fourth embodiment of the invention will be described with reference to FIGS. 7 and 8. Certain units of this apparatus are provided with respective temperature sensors and the apparatus is so adapted that if it starts an idling operation or not is determined on the basis of the temperature of each of the units.

Figure 7:
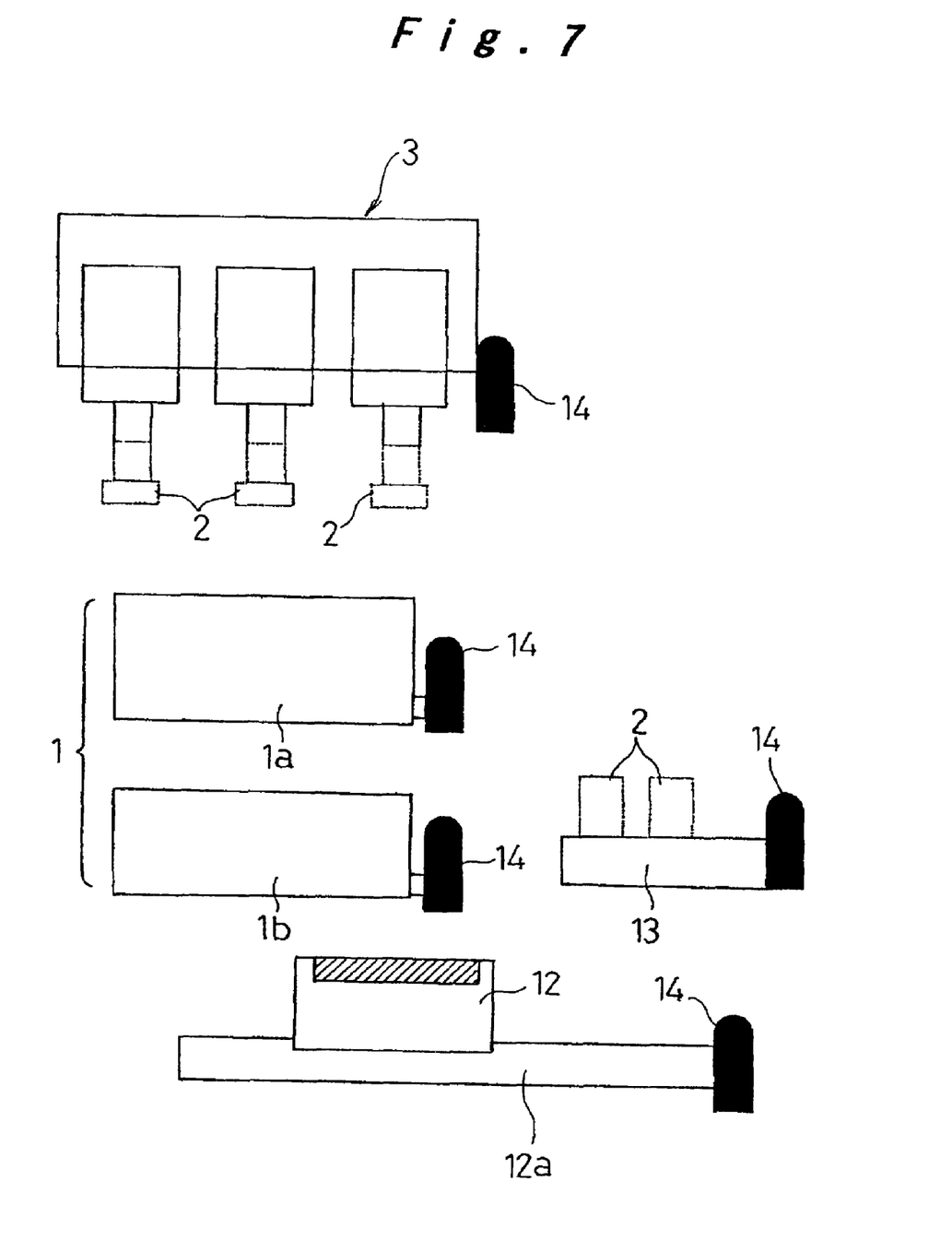
FIG. 7 is a schematic illustration showing arrangement of sensors according to a fourth embodiment of the invention.
Figure 8:
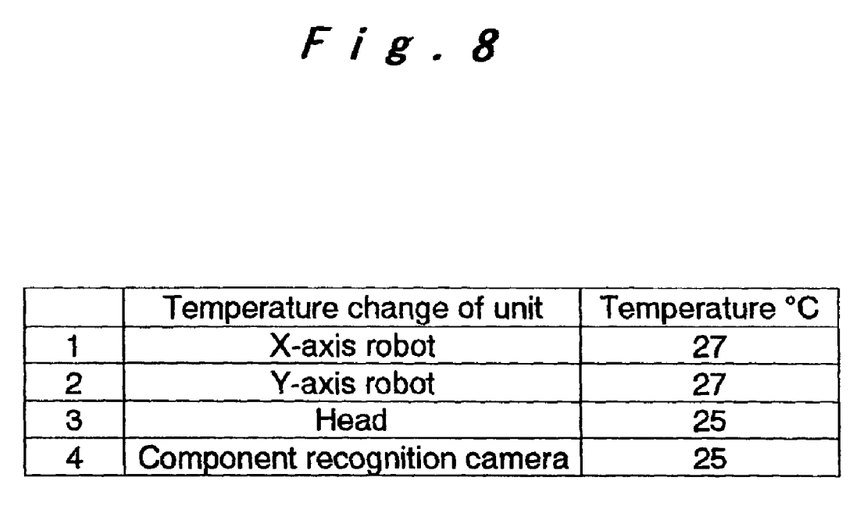
FIG. 8 is a schematic illustration of an image displayed on a screen of a monitor according to the embodiment, the image for selecting the temperatures of different units to be maintained by an idling operation.

As shown in FIG. 7, the X-axis robot 1a and the Y-axis robots 1b of the XY robot 1, the head 3, the component recognition camera 12 and some other units are provided with respective temperature sensors 14 and the operating section 11 is so adapted that the operator sets the reference temperature of each of the units to be referred to for starting an idling operation by way of the operating screen of the operating section 11 as shown in FIG. 8. If the temperature of any of the units as detected by the corresponding sensor falls below the reference temperature and hence the mounting accuracy of the apparatus becomes no longer acceptable, the controller 10 automatically starts an idling operation. In FIG. 7, reference numeral 12a denotes a support of the component recognition camera 12 and reference numeral 13 denotes the nozzle station.

While an idling operation is started when the temperature of any of the units falls the corresponding reference temperature in the above description, it may alternatively be so arranged that each of the certain units is further provided with a heater and the temperature of each of the units is maintained to a certain level by the heater after the end of every actual mounting operation.

Figure 9A:
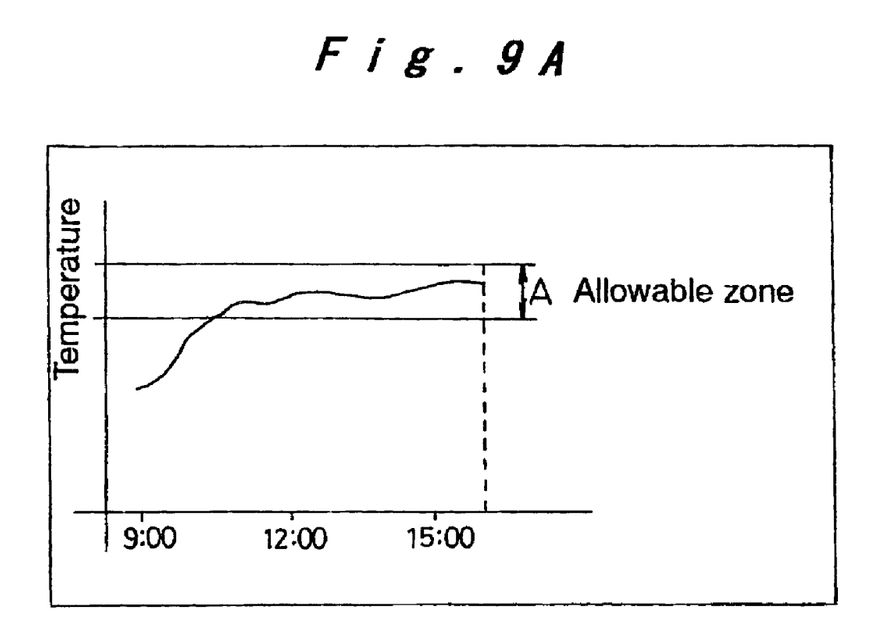
FIGS. 9A and 9B are schematic illustrations of images displayed on the screen of the monitor for showing a transition in unit temperature according to the embodiment.
Figure 9B:
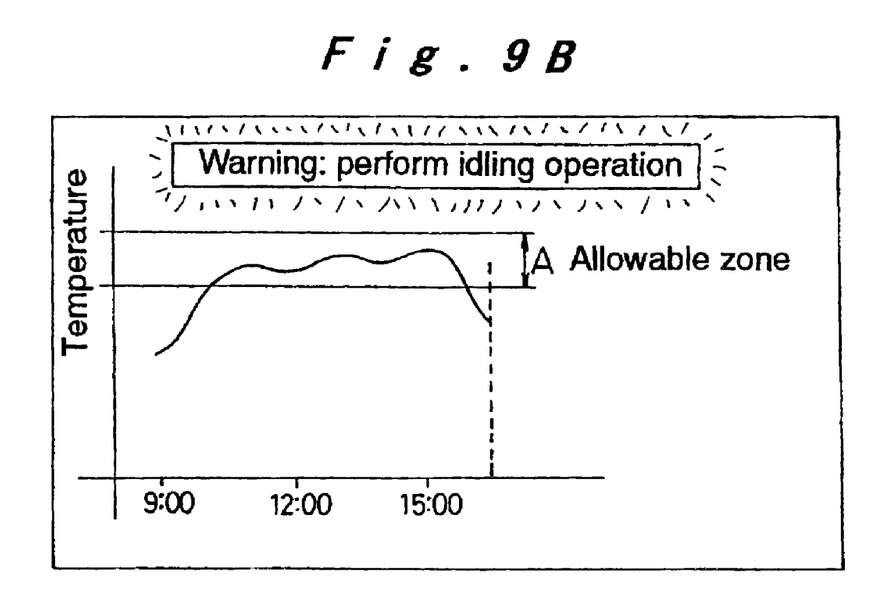

The temperature of each of the units as detected by the corresponding sensor may be displayed on the operating screen or the monitor screen of the operating section 11 to show the transition with time of the temperature in a manner as shown in FIG. 9A. Additionally, it may be so arranged that, when the temperature of any of the units falls below the allowable temperature zone A, a warning message is displayed on the screen as shown in FIG. 9B to prompt the operator for an idling operation. Then, the operator will determine if the apparatus needs an idling operation or not.

Alternatively, it may be so arranged that the controller 10 determines if the apparatus needs an idling operation or not as it monitors the temperature of each of the units.

Data showing the change with time of the temperature of each of the units may be stored and accumulated. When the mounting accuracy of the apparatus falls, they may be analyzed to detect the cause of the degraded mounting accuracy.

As described above, with a component mounting method and a component mounting apparatus according to the invention, the degradation of the component mounting accuracy due to temperature change of any of the units of the apparatus is avoided by an automatic idling operation and/or the use of heaters. The frequency of calibrating operation is therefore reduced. Consequently, the component mounting accuracy is improved remarkably along with improvement of the productivity of the apparatus.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A component mounting method for controlling a component mounting apparatus, comprising:

picking up a component;

positioning the component on a circuit substrate; and mounting the component onto the circuit substrate, wherein a fall of the temperature of the component mounting apparatus is prevented by performing an idling operation automatically during a pause of component mounting operation, such as to reduce degradation of a component mounting accuracy due to temperature changes.

2. The component mounting method according to claim 1, further comprising the step of performing an idling operation automatically during waiting for a next circuit substrate.

3. The component mounting method according to claim 1, further comprising the steps of:

determining if the temperature change of each of units of the apparatus or a suspending period is out of an allowable limit by a controller during a pause of component mounting operation; and performing the idling operation when the temperature change or the suspending period is out of the allowable limit.

4. The component mounting method according to claim 1, further comprising the steps of:

detecting the temperature of each of units of the apparatus by a sensor provided at each of the units; and starting the idling operation automatically based on the detected temperature.

5. The component mounting method according to claim 1, further comprising the steps of:

measuring a duration of the idling operation or the temperature of each of units of the apparatus after the idling operation; and performing the idling operation based on the results of the measurements.

6. A component mounting method for controlling a component mounting apparatus, comprising:

picking up a component;

positioning the component on a circuit substrate; and mounting the component onto the circuit substrate, wherein a fall of the temperature of the component mounting apparatus is prevented by performing an idling operation when a switch of an operating section of the apparatus is turned on, such as to reduce degradation of a component mounting accuracy due to temperature changes.

* * * * *